US009029973B2

(12) United States Patent
Lim et al.

(10) Patent No.: US 9,029,973 B2
(45) Date of Patent: May 12, 2015

(54) IMAGE SENSOR AND METHOD FOR FABRICATING THE SAME

(75) Inventors: Sung-Won Lim, Gyeonggi-do (KR); Jin-Woong Kim, Gyeonggi-do (KR); Hyo-Seok Lee, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 1227 days.

(21) Appl. No.: 12/917,986

(22) Filed: Nov. 2, 2010

(65) Prior Publication Data
US 2012/0001234 A1 Jan. 5, 2012

(30) Foreign Application Priority Data

Jul. 5, 2010 (KR) .................. 10-2010-0064472

(51) Int. Cl.
*H01L 27/144* (2006.01)
*H01L 31/103* (2006.01)
*H01L 31/113* (2006.01)
*H01L 27/146* (2006.01)

(52) U.S. Cl.
CPC ........ *H01L 27/1461* (2013.01); *H01L 27/1463* (2013.01); *H01L 27/14645* (2013.01)

(58) Field of Classification Search
USPC ............... 257/59, 72, 292, 461–465

IPC ................ H01L 29/14614,29/14647, 29/66621, H01L 29/66659, 31/02529, 29/14605, 29/1461, H01L 29/14645

See application file for complete search history.

(56) References Cited

U.S. PATENT DOCUMENTS

| 7,427,734 B2* | 9/2008 | Yang et al. .................. 250/208.1 |
| 7,492,027 B2* | 2/2009 | Mouli ............................ 257/446 |
| 2003/0042511 A1* | 3/2003 | Rhodes ......................... 257/232 |
| 2008/0157145 A1* | 7/2008 | Park .............................. 257/292 |
| 2009/0108385 A1* | 4/2009 | Dungan et al. ................. 257/432 |

FOREIGN PATENT DOCUMENTS

| KR | 1020030000654 | 1/2003 |
| KR | 1020100004064 | 1/2010 |

OTHER PUBLICATIONS

Notice of Preliminary Rejection issued from Korean Intellectual Property Office on Jul. 14, 2011.

* cited by examiner

*Primary Examiner* — Marcos D Pizarro
(74) *Attorney, Agent, or Firm* — IP & T Group LLP

(57) ABSTRACT

An image sensor includes first impurity regions formed in a substrate, second impurity regions formed in the first impurity regions, wherein the second impurity regions has a junction with the first impurity regions, recess patterns formed over the first impurity regions in contact with the second impurity regions, and transfer gates filling the recess patterns.

11 Claims, 6 Drawing Sheets

IMAGE SENSOR AND METHOD FOR FABRICATING THE SAME

CROSS-REFERENCE TO RELATED APPLICATIONS

The present application claims priority of Korean Patent Application No. 10-2010-0064472, filed on Jul. 5, 2010, which is incorporated herein by reference in its entirety.

BACKGROUND OF THE INVENTION

Exemplary embodiments of the present invention relate to a semiconductor device fabrication technology, and more particularly, to an image sensor and a method for fabricating the image sensor.

Image sensors are semiconductor devices which transform an optical image into electrical signals, and a CMOS image sensor (CIS) is widely used. An image sensor includes a color filter array (CFA) to acquire/detect a color image. Herein, the color filter array is composed of three different colors of filters, which are red, green and blue.

FIG. 1 is a cross-sectional view illustrating a conventional image sensor.

Referring to FIG. 1, the conventional image sensor includes a blue pixel active region 20B, a green pixel active region 20G, and a red pixel active region 20R that are defined by an isolation layer 12 formed over a substrate 11. Each of the blue pixel active region 20B, the green pixel active region 20G, and the red pixel active region 20R includes an optical sensor 15, which is formed by a junction of a P-type impurity region 14 and an N-type impurity region 13, and a transfer gate 16. A protective layer 17 is disposed over the substrate 11 including the transfer gate 16, and a color filter array 18 of three colors, which are red R, green G, and blue B, corresponding to the optical sensor 15 of each pixel are disposed over the protective layer 17. A condenser 19 is disposed over the color filter array 18.

The image sensor including the color filter array 18, which is described above, has excellent color separation characteristics. However, in transmission of different colors of light, in case of green G, about 50% of light transmits in the color filter array 18, and in case of red R and blue B, about 25% of light transmit. In short, the image sensor has a drawback of low quantum efficiency.

To prevent the quantum efficiency from being deteriorated due to a color filter array in an image sensor, an image sensor using not the color filter array but the difference in absorption of the light according to its wavelength has been developed.

FIG. 2 is a cross-sectional view illustrating a modified conventional image sensor.

Referring to FIG. 2, the modified conventional image sensor includes an optical sensor 15 which has a structure that a P-type impurity region 14 and an N-type impurity region 13 are alternately disposed multiple times. Herein, blue B, green G, and red R colors of light in order are detected by progressively deeper regions of the N-type impurity region 13 in the optical sensor 15.

The modified conventional technology having the above-described structure may improve the quantum efficiency characteristics because it does not use a color filter array. However, since the optical sensor 15 has a complicated structure, the image sensor may be relatively difficult to manufacture and production yield of image sensor may suffer. Also, since colors are separated by stacking three photodiodes per pixel, that is, junctions of the P-type impurity region 14 and the N-type impurity region 13, according to the modified conventional technology, the light absorption depth may overlap and it may be difficult to separate colors. Therefore, an image sensor that may improve both color separation characteristics and quantum efficiency characteristics simultaneously is useful.

SUMMARY OF THE INVENTION

An exemplary embodiment of the present invention is directed to an image sensor that may improve both color separation characteristics and quantum efficiency characteristics simultaneously, and a method for fabricating the same.

In accordance with an exemplary embodiment of the present invention, an image sensor includes: first impurity regions formed in a substrate; second impurity regions formed in the first impurity regions, wherein the second impurity regions has a junction with the first impurity regions; recess patterns formed over the first impurity regions in contact with the second impurity regions; and transfer gates filling the recess patterns.

In accordance with another exemplary embodiment of the present invention, an image sensor includes: a plurality of active regions defined by an isolation layer formed in a substrate to correspond to a blue pixel region, a green pixel region, and a red pixel region; first impurity regions formed in the plurality of the active regions; second impurity regions formed in the first impurity regions, wherein the second impurity regions are formed with different depths in the substrate; recess patterns formed over the first impurity regions in contact with the second impurity regions; and a transfer gate filling the recess patterns.

In accordance with yet another exemplary embodiment of the present invention, a method for fabricating an image sensor includes: defining a plurality of active regions by forming an isolation formed in a substrate to correspond to a blue pixel region, a green pixel region, and a red pixel region; forming recess patterns over the plurality of the active regions to have different depths from each other; forming first impurity regions in the plurality of the active regions through an ion implantation process; forming a transfer gate filling the recess patterns; and forming second impurity regions in the first impurity regions in contact with edges of bottom surfaces of the recess patterns respectively through an ion implantation process.

DESCRIPTION OF SPECIFIC EMBODIMENTS

Figure 1:
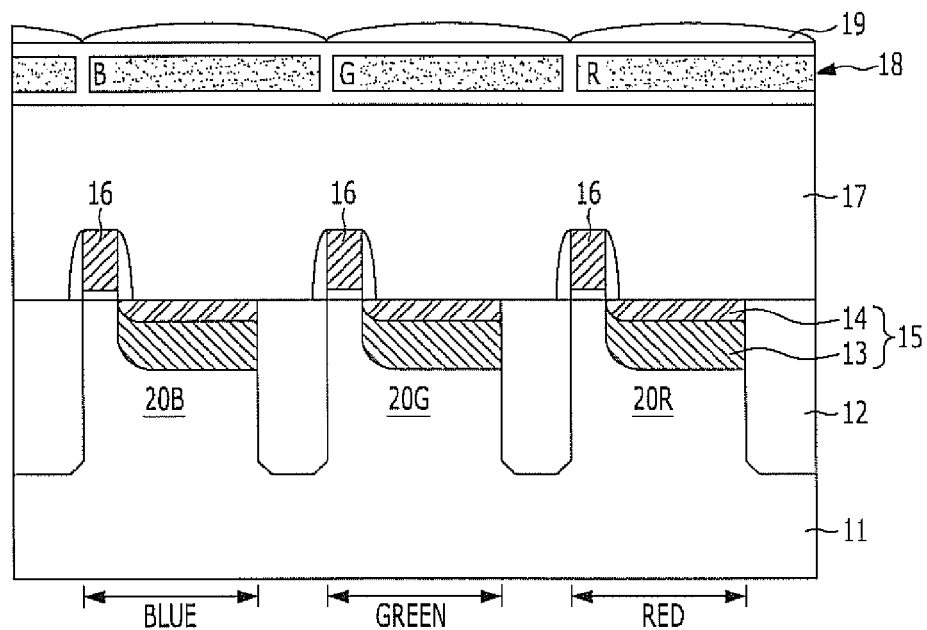
FIG. 1 is a cross-sectional view illustrating a conventional image sensor.
Figure 2:
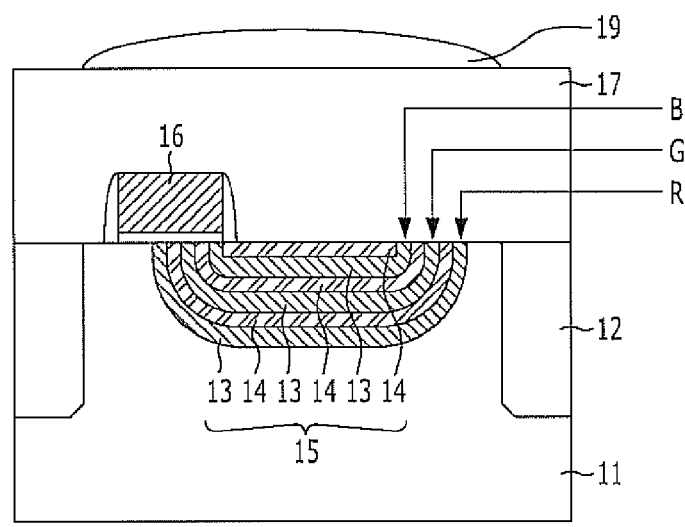
FIG. 2 is a cross-sectional view illustrating a modified conventional image sensor.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

The present invention which is described below discloses an image sensor that may improve both color separation characteristics and quantum efficiency characteristics simultaneously, and a method for fabricating the same. To this end, the prevent invention provides an image sensor that may separate colors without using a color filter array (CFA), and a method for fabricating the image sensor.

Hereafter, a case where an image sensor realizes a color image by using red, green, and blue (RGB) colors is described.

Figure 3:
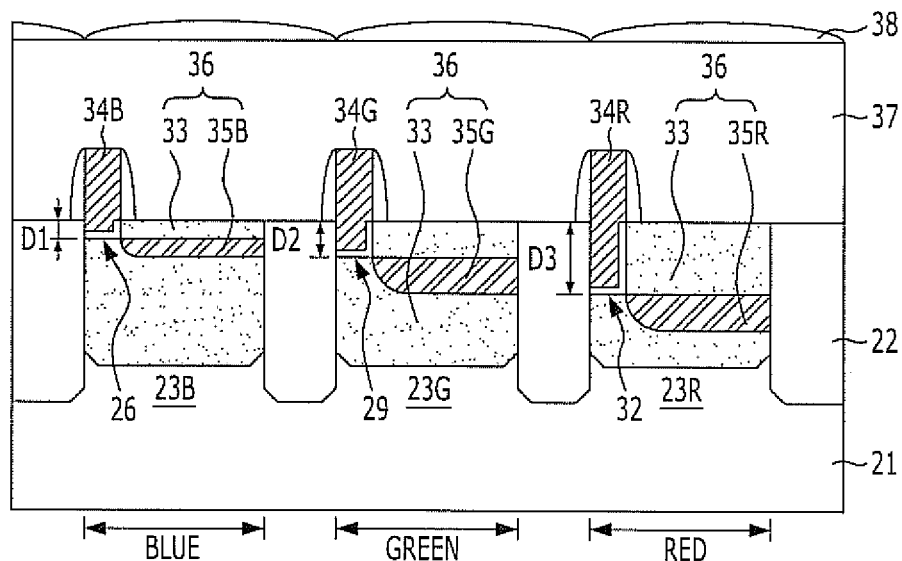
FIG. 3 is a cross-sectional view illustrating an image sensor in accordance with an embodiment of the present invention.

FIG. 3 is a cross-sectional view illustrating an image sensor in accordance with an embodiment of the present invention.

Referring to FIG. 3, an image sensor according to the embodiment of the present invention includes a plurality of active regions 23B, 23G and 23R which are defined by an isolation layer 22 formed over a silicon substrate 21. The plurality of the active regions 23B, 23G and 23R correspond to a plurality of unit pixel regions respectively. The plurality of the unit pixel regions includes a blue pixel region, a green pixel region, and a red pixel region.

In the plurality of the active regions 23B, 23G and 23R corresponding to the plurality of the unit pixel regions, a P-type impurity region 33 is formed. The P-type impurity region 33 may be formed through an ion implantation process and it serves as an optical sensor 36. Therefore, to prevent interference from adjacent unit pixel regions, the depth of the P-type impurity region 33 may be shallower than the depth of the isolation layer 22 based on the upper surface of the silicon substrate 21.

In the P-type impurity region 33 of unit pixel regions, recess patterns 26, 29 and 32 having different depths are formed. The depths of the recess patterns 26, 29 and 32 may be controlled in consideration of the depth of the silicon substrate 21 wherein a particular light, e.g., blue light, green light, or red light, is absorbed. To be specific, the recess pattern 26 formed in the blue pixel region may have a depth D1 ranging from approximately 0 µm to approximately 0.2 µm. Herein, the depth D1 of the recess pattern 26 being '0' means that the recess pattern 26 is not formed. This is because the depth wherein the blue light is absorbed by the silicon substrate 21 ranges from approximately 0 µm to approximately 2 µm. The depth D2 of the recess pattern 29 formed in the green pixel region may range from approximately 0.2 µm to approximately 0.6 µm. Also, the depth D3 of the recess pattern 32 formed in the red pixel region may range from approximately 0.6 µm to approximately 1. µm. Herein, the depths of the recess patterns 26, 29 and 32 are based on the upper surface of the silicon substrate 21.

Over the active regions 23B, 23G and 23R of the unit pixel regions, transfer gates 34B, 34G and 34R respectively filling the recess patterns 26, 29 and 32 are formed. The transfer gates 34B, 34G and 34R may includes a gate insulation layer which fills the recess patterns 26, 29 and 32, a gate electrode which fills the recess patterns 26, 29 and 32 over the gate insulation layer while protruding over the silicon substrate 21, and spacers formed on both sidewalls of the gate electrode protruding over the silicon substrate 21.

In the P-type impurity region 33 of the unit pixel regions, N-type impurity regions 35B, 35G and 35R are formed to be in contact with the edges of the bottom surfaces of the recess patterns 26, 29 and 32. The optical sensor 36 is formed by a junction of the P-type impurity region 33 formed in the unit pixel regions and the N-type impurity regions 35B, 35G and 35R. Herein, the bottom surfaces (i.e., the edges of the bottom surface) of the recess patterns 26, 29 and 32 may be positioned between the upper surfaces and the bottom surfaces of the N-type impurity regions 35B, 35G and 35R in consideration of transfer efficiency of photoelectrons generated in the optical sensor 36. According to the embodiment of the present invention, the upper surfaces of the N-type impurity regions 35B, 35G and 35R and the bottom surface of the recess patterns 26, 29 and 32 are positioned on the same plane.

The N-type impurity regions 35B, 35G and 35R formed in the unit pixel regions may be controlled in consideration of the depth of the silicon substrate 21 wherein a particular light, that is, blue light, green light, or red light, is absorbed. In other words, the N-type impurity regions 35B, 35G and 35R may be positioned between the minimum depth and the maximum depth of the silicon substrate 21 to absorb the particular light. To be specific, the upper surface of the N-type impurity region 35B formed in the blue pixel region may be positioned in the depth range of approximately 0.01 to 0.2 µm. Herein, blue light may be absorbed in the silicon substrate 21 at the depth range of approximately 0 (which is the surface) to 0.2 µm, but the N-type impurity region 35B formed in the blue pixel region may be positioned apart from the surface of the silicon substrate 21 by a certain distance, e.g., 0.01 µm, to form the optical sensor 36 of a PN junction structure.

The upper surface of the N-type impurity region 35G formed in the green pixel region may be positioned in the depth range of approximately 0.02 to 0.6 µm. The upper surface of the N-type impurity region 35R formed in the red pixel region may be positioned in the depth range of approximately 0.6 to 1 µm. Herein, the depths of the upper surfaces of the N-type impurity regions 35B, 35G and 35R are based on the surface of the silicon substrate 21.

A protective layer 37 is formed over the profile of the silicon substrate 21, and a condenser 38 is formed over the protective layer 37 to correspond to the unit pixel regions.

The image sensor according to the exemplary embodiment of the present invention, which has the above-described structure, may improve quantum efficiency characteristics because it does not use a color filter array.

Also, the image sensor may improve color separation characteristics by disposing the optical sensor 36 in the blue pixel region, the green pixel region, and the red pixel region and controlling the positions (which are depths) of the N-type impurity regions 35B, 35G and 35R according to the depths of the silicon substrate 21 to absorb the corresponding light.

Furthermore, since the transfer gates 34B, 34G and 34R have a structure of filling the recess patterns 26, 29 and 32 formed in consideration of the depth of the silicon substrate 21 to absorb the light, the color separation characteristics may be improved even more. To be specific, when transferring photoelectrons generated in the optical sensor 36 to a circuit unit, the image sensor transfer them to a floating diffusion (FD) node through the initial transfer gates 34B, 34G and 34R, first. Herein, since the transfer gates 34B, 34G and 34R having a structure of filling the recess patterns 26, 29 and 32 may increase the transfer efficiency of the photoelectrons generated in the optical sensor 36, the color separation characteristics of the image sensor may be improved.

In consequences, the image sensor according to the exemplary embodiment of the present invention may improve quantum efficiency characteristics and color separation characteristics at the same time.

FIGS. 4A to 4H are cross-sectional views describing a method for fabricating an image sensor in accordance with an embodiment of the present invention.

Figure 4A:
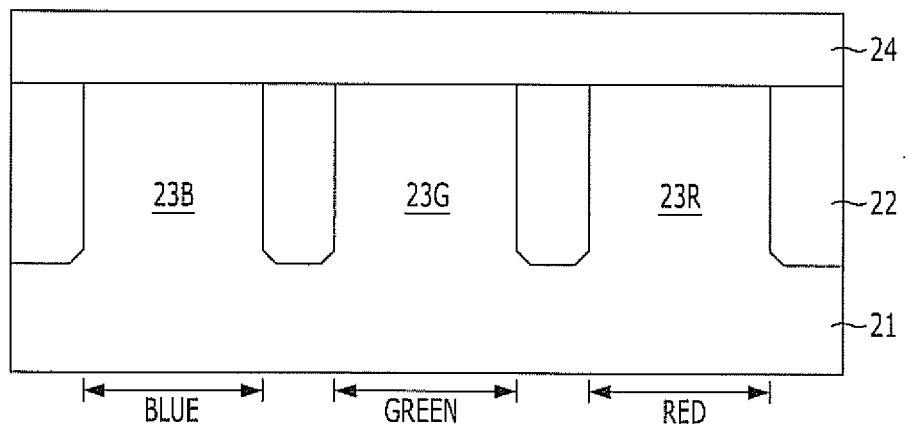
FIGS. 4A to 4H are cross-sectional views describing a method for fabricating an image sensor in accordance with an embodiment of the present invention.

Referring to FIG. 4A, an isolation layer 22 is formed over a silicon substrate 21 having a plurality of unit pixel regions, which include a blue pixel region, a green pixel region, and a red pixel region, to define the active regions 23B, 23G and 23R corresponding to the plurality of the unit pixel regions respectively. Herein, the isolation layer 22 may be formed through a Shallow Trench Isolation (STI) process. Hereafter, for the sake of convenience in description, the plurality of the active regions 23B, 23G and 23R formed in the blue pixel region, the green pixel region, and the red pixel region respectively are referred to as a first active region 23B, a second active region 23G, and a third active region 23R.

Subsequently, a hard mask layer 24 is formed over the profile of the silicon substrate 21. The hard mask layer 24 is used as an etch barrier during an etch process for forming recess patterns in the plurality of the unit pixel regions. The hard mask layer 24 may be a single layer selected from the group consisting of an oxide layer, a nitride layer, an oxynitride layer, and an amorphous carbon layer, or a stacked layer where two or more of these layers are stacked.

Figure 4B:
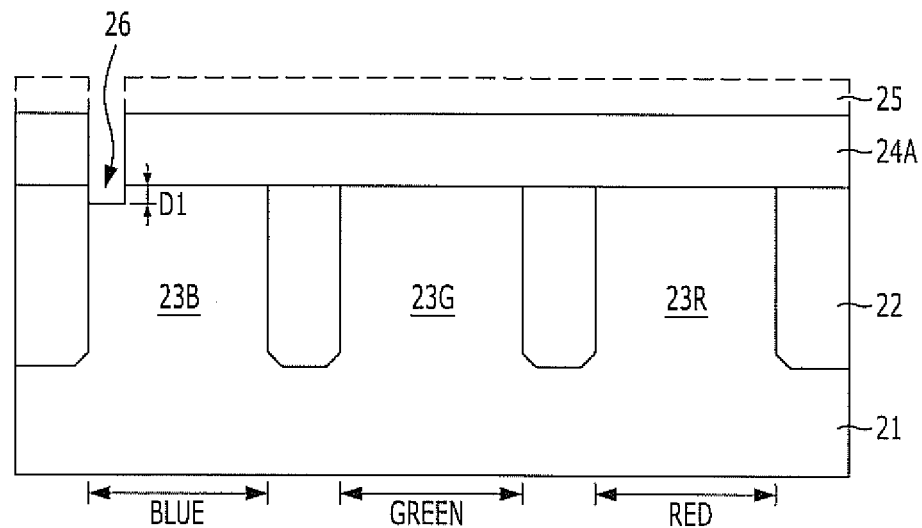

Referring to FIG. 4B, a first photoresist pattern 25 having an opening for exposing a portion of the upper area of the first active region 23B is formed over the hard mask layer 24. Subsequently, the hard mask layer 24 is etched using the first photoresist pattern 25 as an etch barrier. Hereafter, the etched hard mask layer 24 is referred to as a first hard mask layer pattern 24A.

Subsequently, after the first photoresist pattern 25 is removed, the silicon substrate 21 of the first active region 23B is etched using the first hard mask layer pattern 24A as an etch barrier so as to form a recess pattern 26. Hereafter, for the sake of convenience in description, the recess pattern 26 formed in the blue pixel region, which is the first active region 23B, is referred to as a first recess pattern 26.

The depth D1 of the first recess pattern 26 may be controlled in consideration of the depth of the silicon substrate 21 from the surface of the silicon substrate 21 where wavelengths of light corresponding to blue light are absorbed by the silicon substrate 21. To be specific, the blue light is absorbed in the depth range of approximately 0 to 0.2 μm based on the upper surface of the silicon substrate 21. In short, the blue light may penetrate up to the depth of approximately 0.2 μm from the surface of the silicon substrate 21. Therefore, the first recess pattern 26 may be formed to have the depth D1 ranging from approximately 0 μm to approximately 0.2 μm based on the upper surface of the silicon substrate 21.

Herein, the depth D1 of the first recess pattern 26 being '0' signifies that no recess pattern is formed. In other words, the blue light may be absorbed from the surface of the silicon substrate 21, the first recess pattern 26 may be not formed.

Figure 4C:
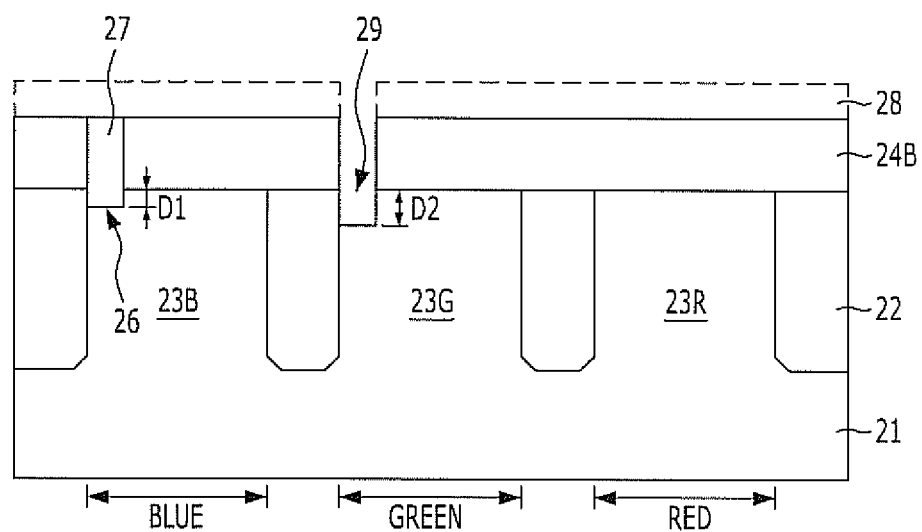

Referring to FIG. 4C, the first recess pattern 26 and an opening of the first hard mask layer pattern 24A are filled with a first sacrificial layer 27.

Subsequently, a second photoresist pattern 28 having an opening that exposes a portion of the upper area of the second active region 23G is formed over the first hard mask layer pattern 24A. Subsequently, the first hard mask layer pattern 24A is etched using the second photoresist pattern 28 as an etch barrier. Hereafter, the etched first hard mask layer pattern 24A is referred to as a second hard mask layer pattern 24B.

Subsequently, after the second photoresist pattern 28 is removed, a portion of the silicon substrate 21 in the second active region 23G is etched using the second hard mask layer pattern 24B as an etch barrier so as to form a recess pattern 29. Hereafter, the recess pattern 29 formed in the second active region 23G is referred to as a second recess pattern 29.

The depth D2 of the second recess pattern 29 may be controlled in consideration of the depth of the silicon substrate 21 from the surface of the silicon substrate 21 where wavelengths of light corresponding to green light are absorbed by the silicon substrate 21. To be specific, the green light is absorbed in the depth range of approximately 0.2 to 0.6 μm based on the upper surface of the silicon substrate 21. In short, the green light may penetrate up to the depth of approximately 0.6 μm from the surface of the silicon substrate 21. Therefore, the second recess pattern 29 may be formed to have the depth D2 ranging from approximately 0.2 μm to approximately 0.6 μm based on the upper surface of the silicon substrate 21.

Figure 4D:
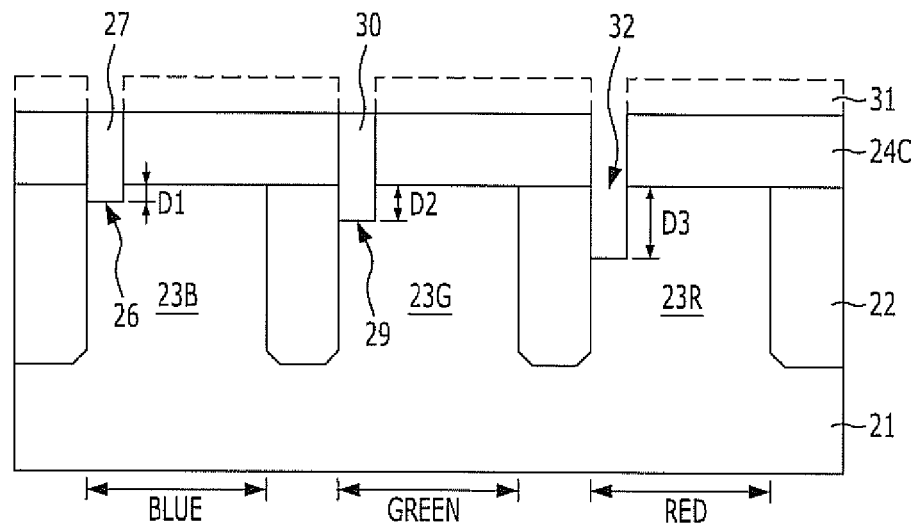

Referring to FIG. 4D, the second recess pattern 29 and an opening of the second hard mask layer pattern 24B are filled with a second sacrificial layer 30.

Subsequently, a third photoresist pattern 31 having an opening that exposes a portion of the upper area of the third active region 23R is formed over the second hard mask layer pattern 24B. Subsequently, the second hard mask layer pattern 24B is etched using the third photoresist pattern 31 as an etch barrier. Hereafter, the etched second hard mask layer pattern 24A is referred to as a third hard mask layer pattern 24C.

Subsequently, after the third photoresist pattern 31 is removed, a portion of the silicon substrate 21 in the third active region 23R is etched using the third hard mask layer pattern 24C as an etch barrier so as to form a recess pattern 32. Hereafter, the recess pattern 32 formed in the third active region 23R is referred to as a third recess pattern 32.

The depth D3 of the third recess pattern 31 may be controlled in consideration of the depth of the silicon substrate 21 from the surface of the silicon substrate 21 where wavelengths of light corresponding to red light are absorbed by the silicon substrate 21. To be specific, the red light is absorbed in the depth range of approximately 0.6 to 1 μm based on the upper surface of the silicon substrate 21. Therefore, the third recess pattern 32 may be formed to have the depth D3 ranging from approximately 0.6 μm to approximately 1 μm based on the upper surface of the silicon substrate 21.

Figure 4E:
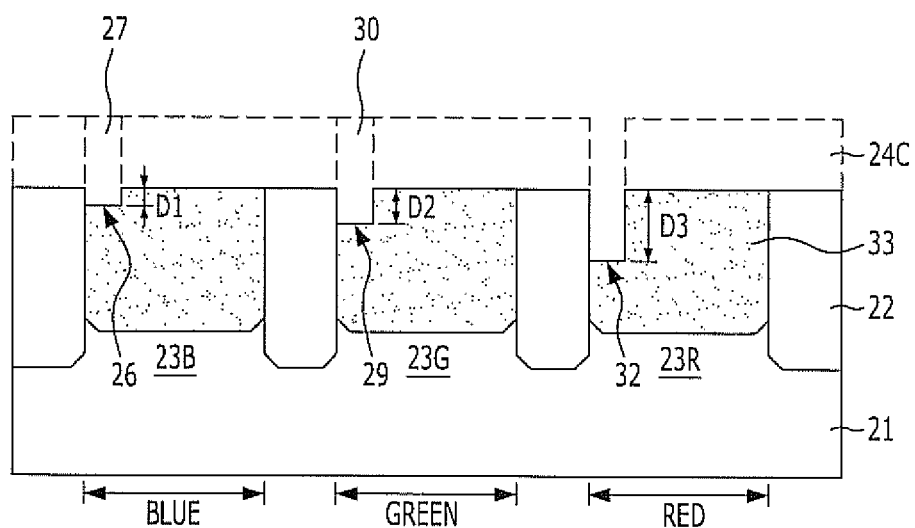

Referring to FIG. 4E, an annealing process may be performed to minimize the etch damage occurring in the course of forming the first to third recess patterns 26, 29 and 32 after the first sacrificial layer 27, the second sacrificial layer 30, and the third hard mask layer pattern 24C are removed. Herein, the annealing process may be performed in the atmosphere of a mixed gas ($H_2/N_2$) of hydrogen gas ($H_2$) and nitrogen gas ($N_2$). As the etch damage is minimized through the annealing process, dark defect of the image sensor may be suppressed/prevented from occurring.

Subsequently, a P-type impurity region 33 is formed in the first to third active regions 23B, 23G and 23R by ion-implanting a P-type impurity into the surface of the silicon substrate 21. The P-type impurity region 33 functions as an optical sensor of the image sensor. Herein, the P-type impurity region 33 formed in the first to third active regions 23B, 23G and 23R may be isolated by the isolation layer 22 in order to decrease the interference caused by adjacent unit pixel regions to each other. In short, the depth of the P-type impurity region 33 may be shallower than the depth of the isolation layer 22 based on the upper surface of the silicon substrate 21.

Figure 4F:
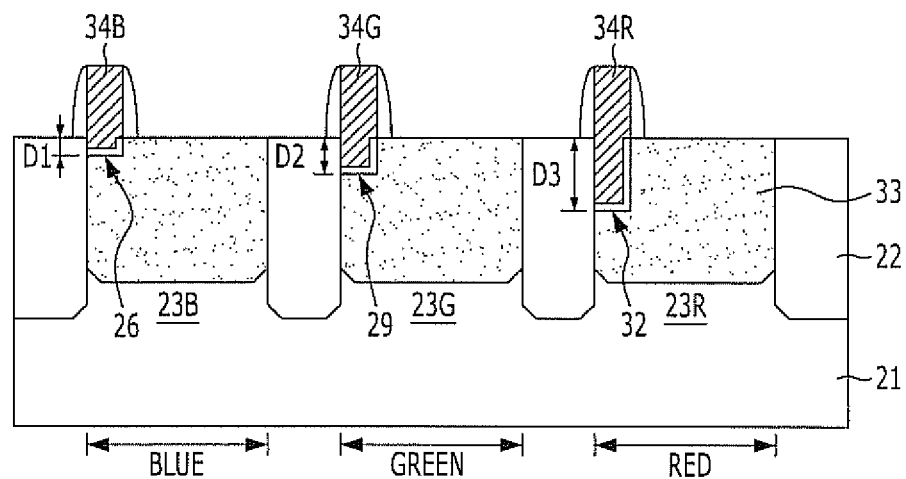

Referring to FIG. 4F, first to third transfer gates 34B, 34G and 34R filling the first to third recess patterns 26, 29 and 32 are formed over the first to third active regions 23B, 23G and 23R, respectively.

Each of the first to third transfer gates 34B, 34G and 34R has a structure to fill the corresponding recess pattern while protruding upward over the silicon substrate 21. The first to third transfer gates 34B, 34G and 34R include a gate insulation layer formed on the first to third recess patterns 26, 29 and 32, a gate electrode formed over the gate insulation layer, and spacers formed on both sidewalls of the gate electrode.

To be specific, the first to third transfer gates 34B, 34G and 34R may be formed through a series of processes of forming the gate insulation layer on the first to third recess patterns 26, 29 and 32, forming a gate conductive layer over the profile of the silicon substrate 21 including the gate insulation layer, forming the gate electrode by selectively etching the gate conductive layer in such a manner that a portion of the gate electrode fills the first to third recess patterns 26, 29 and 32 and the other protrudes upward over the silicon substrate 21, and forming the spacers on both sidewalls of the gate electrode.

Meanwhile, in the blue pixel region, the first recess pattern 26 may not be formed. When the first recess pattern 26 is not formed, the first transfer gate 34B may be a planar type.

Figure 4G:
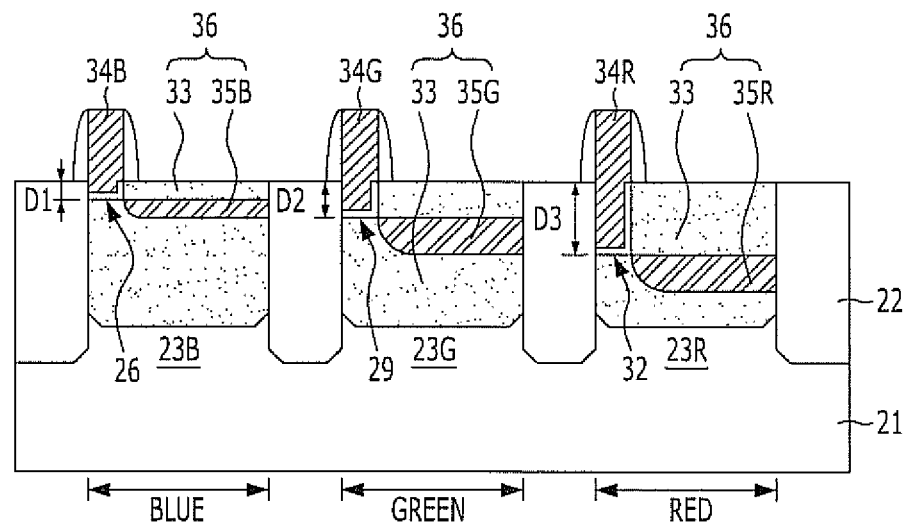

Referring to FIG. 4G, N-type impurity regions 35B, 35G and 35R are formed in the P-type impurity region 33 of the unit pixel regions in contact with the edges of the bottom surface of the first to third recess patterns 26, 29 and 32. Herein, the N-type impurity regions 35B, 35G and 35R may be formed through an ion-implantation process. The implantation depth may be controlled for each unit pixel region by controlling ion implantation energy. As a result, the optical sensor 36 formed by a junction of the P-type impurity region 33 and the N-type impurity regions 35B, 35G and 35R may be formed in the unit pixel regions.

The N-type impurity regions 35B formed in the blue pixel region is formed to have the upper surface positioned in the depth range of approximately 0.01 to 0.2 µm in consideration of the absorption depth of the blue light by the silicon substrate 21. The N-type impurity regions 35G formed in the green pixel region is formed to have the upper surface positioned in the depth range of approximately 0.2 to 0.6 µm in consideration of the absorption depth of the green light by the silicon substrate 21. Also, the N-type impurity regions 35R formed in the red pixel region is formed to have the upper surface positioned in the depth range of approximately 0.6 to 1 µm in consideration of the absorption depth of the red light by the silicon substrate 21. Herein, the depths of the upper surfaces and bottom surfaces of the N-type impurity regions 35B, 35G and 35R are based on the surface of the silicon substrate 21.

Figure 4H:
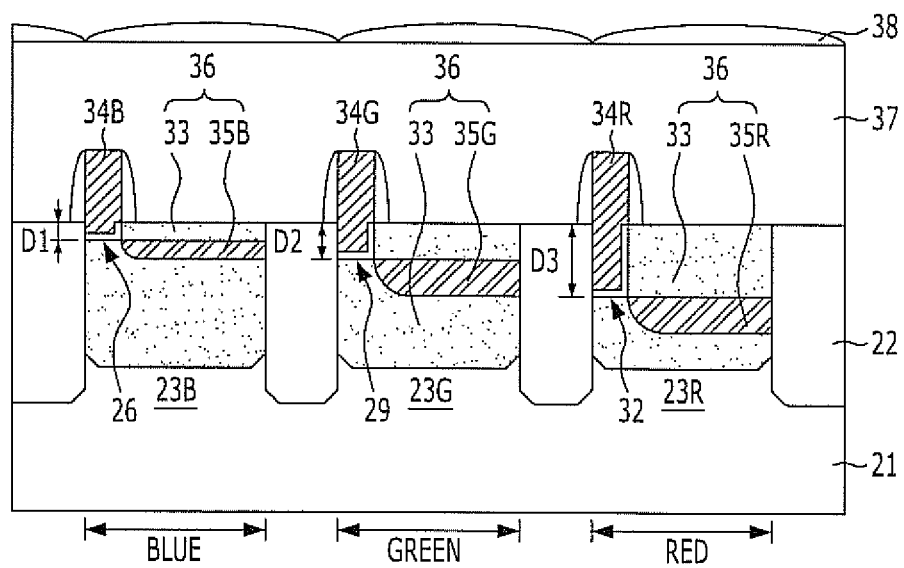

Referring to FIG. 4H, a protective layer 37 is formed over the profile of the silicon substrate 21, and a condenser 38 is formed over the protective layer 37 to correspond to the unit pixel regions.

Through the fabrication process described above, the image sensor can improve both color separation characteristics and quantum efficiency characteristics simultaneously.

An image sensor according to an exemplary embodiment of the present invention described above may improve quantum efficiency characteristics because it does not use a color filter array.

Also, the image sensor includes an optical sensor corresponding to each unit pixel area, and the optical sensor controls the position (or depth) of an N-type impurity region according to the depth of the substrate to absorb the light. Therefore, color separation characteristics may be improved.

In addition, since the image sensor has a structure where a transfer gate fills a recess pattern formed in consideration of the depth of the substrate to absorb the light, the color separation characteristics may be improved even more.

In consequences, the image sensor according to an exemplary embodiment of the present invention may improve both quantum efficiency characteristics and color separation characteristics simultaneously.

While the present invention has been described with respect to the specific embodiments, it will be apparent to those skilled in the art that various changes and modifications may be made without departing from the spirit and scope of the invention as defined in the following claims.

What is claimed is:

1. An image sensor, comprising:
a plurality of active regions defined by an isolation layer formed in a substrate to correspond to a blue pixel region, a green pixel region, and a red pixel region;
first impurity regions formed in the plurality of the active regions;
second impurity regions formed in the first impurity regions, wherein the second impurity regions are formed with different depths in the substrate;
recess patterns formed over the first impurity regions in contact with the second impurity regions; and
transfer gates filling the recess patterns,
wherein a height of the transfer gate formed in the red pixel region is greater than a height of the transfer gate formed in the green pixel region,
wherein the height of the transfer gate formed in the green pixel region is greater than a height of the transfer gate formed in the blue pixel region.

2. The image sensor of claim 1, wherein the recess pattern formed in the blue pixel region has a depth in the substrate ranging from approximately 0 µm to approximately 0.2 µm; the recess pattern formed in the green pixel region has a depth in the substrate ranging from approximately 0.2 µm to approximately 0.6 µm; and the recess pattern formed in the red pixel region has a depth in the substrate ranging from approximately 0.6 µm to approximately 1 µm.

3. The image sensor of claim 1, wherein an upper surface of the second impurity region formed in the blue pixel region is positioned in a depth range of approximately 0.01 to 0.2 µm; an upper surface of the second impurity region formed in the green pixel region is positioned in a depth range of approximately 0.2 to 0.6 µm; and an upper surface of the second impurity region formed in the red pixel region is positioned in a depth range of approximately 0.6 to 1 µm.

4. An image sensor, comprising:
first impurity regions formed in a plurality of unit pixel regions including a blue pixel region, a green pixel region, and a red pixel region disposed in a substrate;
second impurity regions formed in the first impurity regions, wherein the second impurity regions has a junction with the first impurity regions;
recess patterns formed over the first impurity regions in contact with the second impurity regions; and
transfer gates filling the recess patterns,
wherein a height of the transfer gate formed in the red pixel region is greater than a height of the transfer gate formed in the green pixel region,
wherein the height of the transfer gate formed in the green pixel region is greater than a height of the transfer gate formed in the blue pixel region.

5. The image sensor of claim 4, wherein the recess patterns have bottom surfaces in area between upper surfaces and bottom surfaces of the second impurity regions, wherein the bottom surfaces of the recess patterns have edges are in contact with the second impurity regions.

6. The image sensor of claim 4, wherein the second impurity regions are formed with different depths in the substrate, respectively, and the depths of the second impurity regions are each determined according to an absorption depth of a corresponding light in the substrate to be detected.

7. The image sensor of claim 4, wherein the second impurity regions are positioned between a minimum depth and a maximum depth of the substrate to absorb a particular light.

8. The image sensor of claim 4, wherein the transfer gates comprises:
 a gate insulation layer formed on the recess patterns;
 a gate electrode filling the recess patterns over the gate insulation layer while protruding upward over the substrate; and
 spacers formed on both sidewalls of the gate electrode.

9. The image sensor of claim 4, wherein the first impurity regions are of a P-type impurity region and the second impurity regions are of an N-type impurity region.

10. The image sensor of claim 4, further comprising:
 an isolation layer formed over the substrate to define a plurality of active regions corresponding to a plurality of unit pixel regions,
 wherein the first impurity regions are disposed in the plurality of the active regions.

11. The image sensor of claim 10, wherein depths of the first impurity regions are shallower than a depth of the isolation layer.

\* \* \* \* \*